United States Patent [19]
Takahashi et al.

[11] Patent Number: 5,224,325
[45] Date of Patent: Jul. 6, 1993

[54] PACKAGING SEQUENCE DETERMINING METHOD

[75] Inventors: Shino Takahashi; Hideaki Kobayashi; Masahito Takata, all of Yokohama, Japan

[73] Assignee: Hitachi, Ltd., Tokyo, Japan

[21] Appl. No.: 788,788

[22] Filed: Nov. 6, 1991

[30] Foreign Application Priority Data

Nov. 6, 1990 [JP] Japan ................... 2-300710

[51] Int. Cl.⁵ .............. B65B 5/08; B65B 15/02
[52] U.S. Cl. ..................... 53/443; 29/834; 53/445
[58] Field of Search ............ 53/443, 396, 474, 51, 53/55, 238, 244, 155, 445; 29/740, 741, 759, 834, 835, 836

[56] References Cited

U.S. PATENT DOCUMENTS

| | | | |
|---|---|---|---|
| 4,293,998 | 10/1981 | Kawa et al. | 29/835 X |
| 4,342,090 | 7/1982 | Caccoma et al. | 29/834 X |
| 4,539,740 | 9/1985 | Scrantom et al. | 29/835 X |
| 4,630,428 | 12/1986 | Lesch | 53/238 X |
| 4,969,256 | 11/1990 | Shimizu et al. | 29/834 |
| 4,980,970 | 1/1991 | Uchida et al. | 29/836 X |
| 5,083,281 | 1/1992 | Rabindran et al. | 53/55 X |
| 5,086,559 | 2/1992 | Akatsuchi | 29/834 |

FOREIGN PATENT DOCUMENTS

63-204301 8/1988 Japan.

OTHER PUBLICATIONS

*Electronic Packaging & Production*, "Automatic Component Insertion/Placement Systems Ready for the Automated Factory", by H. W. Markstein. Published Aug. 1984.

Primary Examiner—Horace M. Culver
Attorney, Agent, or Firm—Antonelli, Terry, Stout & Kraus

[57] ABSTRACT

A method of determining the packaging sequence of a packaging machine for mounting parts on a substrate at a plurality of designated positions by placing a substrate on a table and displacing the table relative to a parts holding device the method includes the steps of determining the displacing sequence to satisfy a constraint concerning the packaging sequence and to minimize the total amount of displacement of the table when mounting the parts on the substrate, and grouping together the parts that are to be successively mounted on the substrate at each of the designated positions after the table has been displaced relative to the parts holding device.

23 Claims, 18 Drawing Sheets

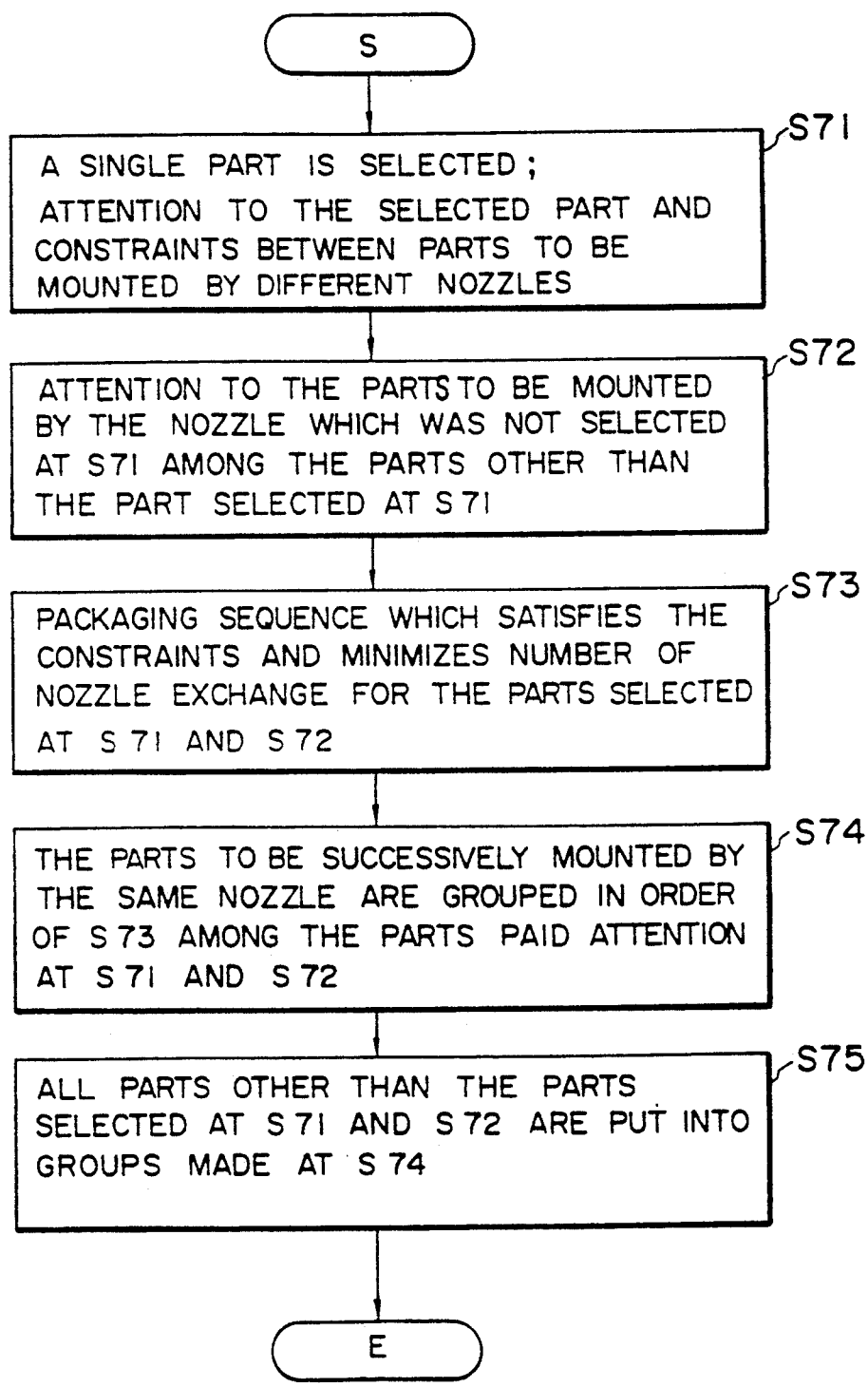

d ⟶ e (CONSTRAINT)

| PART \ PART | g | h | i | j | k |
|---|---|---|---|---|---|
| g |   | O | 1 | O | O |
| h | O |   | O | 1 | 1 |
| i | O | O |   | O | O |
| j | O | O | O |   | O |
| k | O | O | O | O |   |

PACKAGING SEQUENCE DETERMINING METHOD

BACKGROUND OF THE INVENTION

1. Field of the Invention

This invention relates generally to a method of determining the parts packaging sequence, and more particularly to a method of determining the packaging sequence of an automatic packaging machine so as to mount parts, which have a constraint concerning the packing sequence, on a substrate in a short packaging time.

2. Description of the Related Art

A packaging machine includes an XY table turning inserter, an XY head turning inserter, a one-by-one sequence mounter, and XY table type one-by-one random access mounter, an XY head type one-by-one random access mounter shown in FIGS. 16, 17, 18, 19 and 20, respectively. FIGS. 8(a) through 8(e) are expanded figures of parts supply portion, table, etc. of these machines. FIG. 8(a) is the XY table turning inserter; (b), the Xy head turning inserter; (c), the one-by-one sequence mounter; (d) and the XY table type one-by-one random access mounter.

When creating NC data for a packaging machine, it is necessary to determine the packaging sequence.

FIGS. 10 through 12 of the accompanying drawings show conventional methods.

The method of FIG. 10 is a one-point search method. In this method, when mounting parts on a substrate 101, the packaging sequence of all parts is determined by sequentially selecting the part nearest to the part that has been mounted (or the part whose standby time for movement in the XY direction is shortest or the part whose standby time for supply is shortest or the part whose standby time for the turn of an XY table is shortest).

The method of FIGS. 11(a) and 11(b) is a method to be used in a packaging machine having a rotary index (not shown). After a part b has been mounted, a part that can complete both the movement of an XY table (not shown) carrying a substrate 112 and the movement of a parts supply portion 111 is selected to be mounted next while the rotary index turns for a single part.

FIG. 11(a) shows the range of the parts supply portion 111 within which a part next to the part b can be mounted, and FIG. 11(b) shows the range of the substrate 112 within which a part next to the part b can be mounted.

In this condition, if there is no part that can be selected next, the condition is softened to determine the packaging sequence of all parts.

FIG. 12 shows a packaging sequence in which parts are arranged orderly like IC parts.

The substrate 121 is divided into regions in the X direction (or the Y direction), and parts c within each region are sequenced in ascending or descending order of the Y coordinate (or the X coordinate); thus the packaging sequence for all parts in all regions are determined. This prior art is exemplified by Japanese Patent Laid-Open Publication No. SHO 63-204301.

A one-point search method is used when the packaging sequence is determined in the XY table turning inserter, the XY head turning inserter, the one-by-one sequence mounter, and the XY table type one-by-one random access mounter. In the above mentioned packaging machines, a substrate is placed on an XY table to change the mounting position of the parts by movement of the XY table. In this case, packaging the parts in succession which are located nearby the parts being mounted, would reduce the amount of movement of the table, resulting in completing the packaging in a short time. In the one-point search method, however, there is a case in which some parts that are located relatively nearby the parts being mounted, would not be the nearest parts and would be left behind to the last, like the part A in FIG. 10, thereby the amount of movement of the table is increased as a whole.

The method of determining the packaging sequence shown in FIG. 11 cannot be adopted to the XY table turning inserter, the XY head turning inserter, or the XY head type one-by-one random access mounter because this method can be adopted only to a packaging machine having a rotary index. Further, also in the packaging machine having the rotary index such as the one-by-one sequence mounter, the XY table type one-by-one random access mounter, there is a problem that a constraint with respect to the turning speed of the rotary index itself is not considered in the method shown in FIG. 11.

This problem that the constraint with respect to the turning speed of the rotary index itself is not considered, is caused by the following reasons. The rotary index, in most cases, is capable of controlling the turning speed. If the mounting part, which are the parts to be drawn by the nozzle of the rotary index, is easy to be picked and hard to be dropped down during the turn at a high speed, then the constraint that packaging can be carried out at high speed is established. On the other hand, if the part is easy to fall down, then the constraint that packaging should be carried out at a low-speed turn and the part which can bear a high-speed turn, are simultaneously drawn by the rotary index, it is necessary to adjust the turning speed to the low-speed turning part. Therefore, it is not desirable to take a plurality of parts which require different turning speeds, because it makes the packaging time longer.

The method of determining the packaging sequence by dividing into regions as shown in FIG. 12, can be employed in the XY table turning inserter, the XY head turning inserter, the one-by-one sequence mounter and the XY table type one-by-one random access mounter. However, adopting this method to a substrate on which parts are not arranged orderly, would be a large loss in movement of the substrate. This problem is caused by the reason similar to that of the one-point search method described above. Further, when determining the packaging sequence, it would be necessary to satisfy a constraint concerning the packaging sequence.

This constraint may be such that a determined packaging sequence should be carried out with out damaging any other part when each part is mounted.

Consequently, a packaging sequence should be determined to satisfy a constraint such that each part does not damage any other part. Further, conventional systems are disclosed in "Automatic Components Insertion/Placement Systems Ready for the Automatic Factory" by H. W. Markstein, Electronic Packaging and Production, pp. 106-112, August 1984. Markstein discloses an example of a packaging machine as illustrated in FIG. 8 of the present application. However, Markstein suffers from the same disadvantages shown above with respect to Japanese Patent Laid-Open Publication No. SHO 63-204301.

Further conventional systems are disclosed in U.S. Pat. Nos. 4,293,998; 4,342,090; 4,539,740 and 4,969,256. Each of these references discloses a structure for an automatic inserter device particularly as it relates to a parts supply structure, a position determining mechanism and an automatic inserter for axial parts. However, these references suffer from the disadvantages described above being that they do not address the problems associated with the packaging sequence.

Other conventional systems are disclosed in U.S. Pat. Nos. 4,980,970; 5,083,281; 5,086,559 and 4,630,428.

U.S. Pat. Nos. 4,980,970; 5,083,281; and 5,086,559 each discloses automatic insertion and placing apparatus. However, these conventional systems suffer from the disadvantages described above being that they do not attempt to optimize the speed of packaging by determining the packaging sequence of the parts. U.S. Pat. No. 4,630,428 suffers from the disadvantage of not adjusting the packaging sequence depending on the positional relationship between the packaging machine and the parts.

None of the foregoing conventional methods, however, considered any constraint concerning the packaging sequence.

SUMMARY OF THE INVENTION

It is therefore an object of this invention to provide a method for determining an optimum packaging sequence so as to satisfy a constraint concerning the packaging sequence and so as to comply with the operation characteristics (or the structure) of a packaging machine.

According to a first aspect of the invention, there is provided a method of determining the packaging sequence of a packaging machine for mounting parts on a substrate at a plurality of designated positions by placing a substrate on a table and displacing the table relative to a parts holding means, the method comprising: determining the displacing sequence so as to satisfy a constraint concerning the packaging sequence and so as to minimize the total amount of displacement of the table when mounting the parts on the substrate; and grouping the parts that are to be successively mounted on the substrate at each of the designated positions after the table has been displaced relative to the parts holding means.

According to a second aspect of the invention, there is provided a method of determining the packaging sequence of a packaging machine for mounting parts on a substrate at a plurality of designated positions by placing a substrate on a moving table, the method comprising: segmenting the moving speed and the moving sequence so as to satisfy a constraint concerning the packaging sequence and so as to optimize the moving speed of the table when mounting the parts on the substrate; and grouping the parts that pertain to the same speed segment.

According to a third aspect of the invention, there is provided a method of determining the packaging sequence of a packaging machine for mounting parts on a substrate at a plurality of designated positions, the packaging machine having a rotary index, the method comprising: segmenting the turning speed and determining the turning sequence so as to satisfy a constraint concerning the packaging sequence and so as to optimize the turning speed of the rotary index when mounting the parts on the substrate; and grouping the parts that pertain to the same sequence and the same speed segment.

According to a fourth aspect of the invention, there is provided a method of determining the packaging sequence of a packaging machine for mounting parts on a substrate at a plurality of designated positions, the packaging machine having a parts holding means, the method comprising: determining the exchanging sequence so as to satisfy a constraint concerning the packaging sequence and so as to optimize the number of exchanges of holding portions of the parts holding means when mounting the parts on the substrate; and grouping the parts that are to be mounted on the substrate in the same sequence by the same holding portion.

With the method which satisfies a constraint to the packaging sequence and then groups the parts so as to minimize a total amount of turn of a table, it is possible to optimize the turning time of the table, which is influential on the packaging time of a rotary automatic inserter.

With the method which satisfies a constraint to the packaging sequence and then groups the parts so as to optimize the moving speed of a table, it is possible to optimize the moving speed of an XY table, which is influential on the packaging time of an automatic random access mounter having an XY table.

With the method which satisfies a constraint to the packaging sequence and then groups the parts so as to minimize the number of exchanges of nozzles, it is possible to optimize the number of exchanges of the nozzles, which is influential on the packaging time of an automatic random access mounter having an XY table.

BRIEF DESCRIPTION OF THE DRAWINGS

FIG. 7 is a flow diagram showing a grouping process which minimizes the number of exchange of nozzles;

DETAILED DESCRIPTION OF THE PREFERRED EMBODIMENTS

The operation characteristics of a packaging machine to which the packaging sequence determining method of this invention will now be described.

FIGS. 8(a) through 8(e) show various types of packaging machines for carrying out the packaging sequence determining method of this invention.

The packaging machines can be divided broadly into two types, i.e., inserters and mounters, which can be subdivided by the difference in operation of the head which grips a part such as by suction.

Figure 8A:
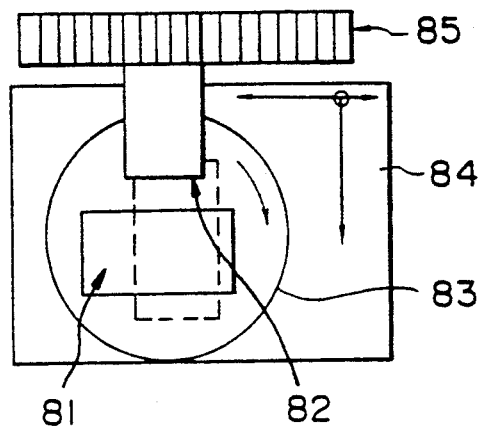
FIGS. 8(a) through 8(e) illustrate the principles of packaging machines to which this invention is to be applied.
Figure 8B:
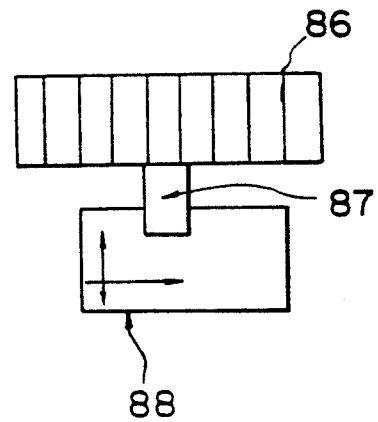
Figure 8C:
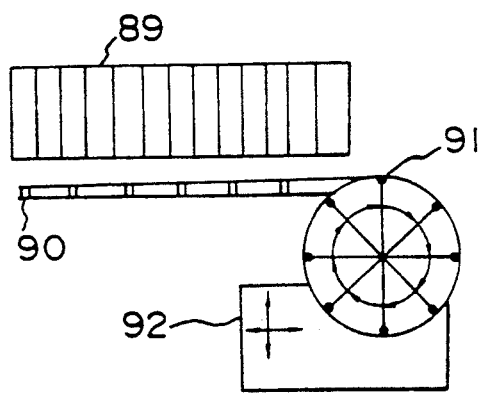
Figure 8D:
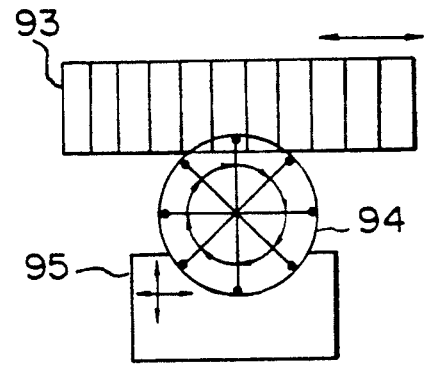

Specifically, FIG. 8(a) shows an XY table turning inserter; FIG. 8(b), and XY head turning inserter; FIG. 8(c), a one-by-one-sequence inserter; FIG. 8(d), a one-by-one random access mounter having an XY table; and FIG. 8(e), a one-by-one random access mounter having an XY head.

In the XY table turning inserter of FIG. 8(a), when mounting parts of different packaging directions (directions in which parts are to be arranged on a substrate or directions in which parts are to be located on a substrate with respect to a predetermined position), a turntable 83 carrying thereon a substrate 81 is turned. Consequently, the time needed to turn is long compared to the other operations (i.e., the XY movement of the turntable 83, the change of pitch to comply with the size of a part and the movement of a parts supply portion 85) before packaging, and hence the total amount of turn should be minimized.

In the XY head turning inserter of FIG. 8(b), the packaging direction can be changed in a short time by turning a head 87. Therefore, various operations (i.e., the XY movement of an XY turntable 88, the change of pitch to comply with the size of a part, the movement of a parts supply portion 86 and the turning of the head 87) can be performed in an average time. In determining the packaging sequence, all of these operations should be considered.

In the one-by-one-sequence mounter of FIG. 8(c), since parts are prepared beforehand in a mounting sequence, the movement of a part supply portion 89 should not be considered. Further, since the operations (such as the turning of a head) other than the XY movement of an XY table 92 is performed within the turning time of a rotary index 91 for a single part, the packaging sequence should be determined only by considering the turning time of the rotary index for a single part and the XY movement of the head.

In the XY-table-type one-by-one random access inserter of FIG. 8(d), a part supply portion 93 moves to take parts in the mounting sequence. Since the operations (such as the turning of the head) other than the movement of the parts supply portion 93 and the movement of an XY table 95 are performed within the turning time of a rotary index 94 for a single part, the packaging sequence should be determined from the turning time of the rotary index 94 for a single part, the movement of the parts supply portion 93 and the XY movement of the XY table 95.

Figure 8E:
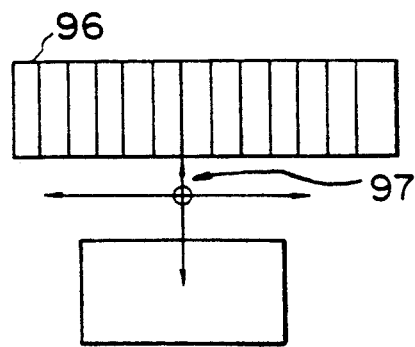

In the XY-head-type one-by-one random access mounter of FIG. 8(e), a mounting head, with a parts supply portion 96 fixed, moves in the XY direction to take parts in. In this method, the packaging sequence should be determined so as to minimize the moving time of the XY head.

A typical constraint concerning the packaging sequence will now be determined with reference to FIG. 9.

Figures 9A, 9B, 9C:
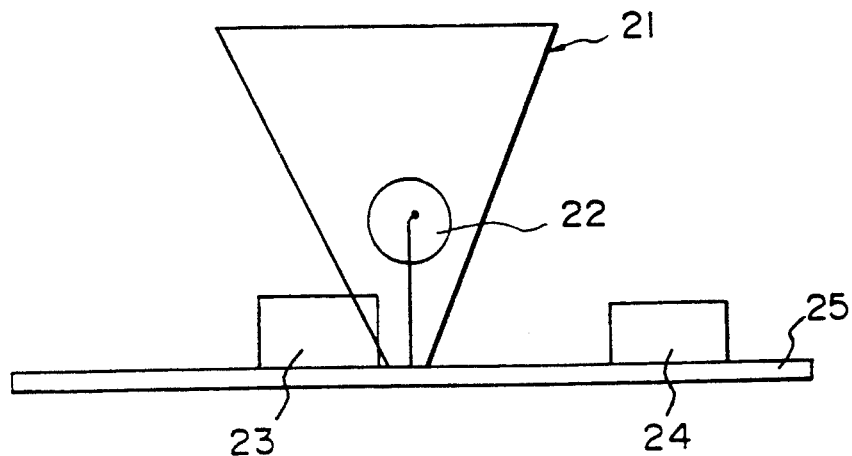
FIGS. 9(a) through 9(c) illustrate a constraint concerning the packaging sequence.

The position of a head 21 when a part d 22 is to be mounted on a substrate 25 is as shown in FIG. 9(a). If there are previously mounted parts e 23, f 24, the part e 23 will interfere with or strike the head 21.

Therefore, with the part e 23 already mounted, the part d 22 cannot be mounted; that is, there is a constraint that the part d 22 should be mounted before the part e 23. This constraint is represented by (d-e) as shown in FIG. 9(b).

In order to express whether or not a constraint exists between parts when a number of parts are to be mounted on a substrate, the matrix of FIG. 9(c) is used. In this matrix, 1 represents the presence of a constraint while 0 represents the absence of a constraint. In the illustrated example, there exist constraints g-i, h-j and h-k.

Embodiments of this invention will now be described with reference to FIGS. 1 through 7.

Figure 2:
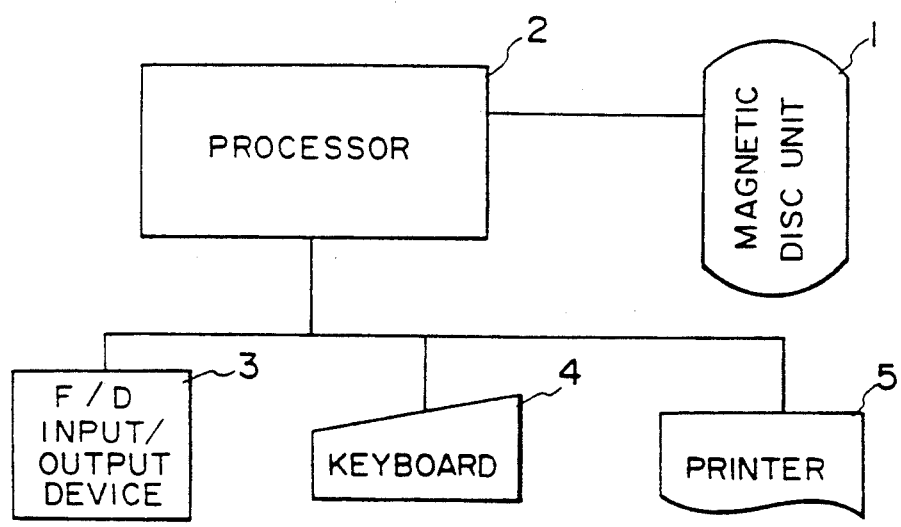
FIG. 2 is a block diagram showing an information processing system for carrying out the packaging sequence determining method of the invention.

FIG. 2 shows a typical information processing system for carrying out the packaging sequence determining method of this invention.

In FIG. 2, reference numeral 1 designates a magnetic disc unit in which information concerning the packaging time, information concerning the type of packaging machine, information concerning the positions in which parts are to be mounted on a substrate, etc. are stored; 2, a processor for performing various kinds of operations; and 3, an input/output device in the form of a floppy disc for inputting information concerning the positions in which parts are to be mounted on a substrate and for outputting the operation result. 4 designates a keyboard as an auxiliary input unit, and 5 designates a printer as an auxiliary output unit.

Figure 1:
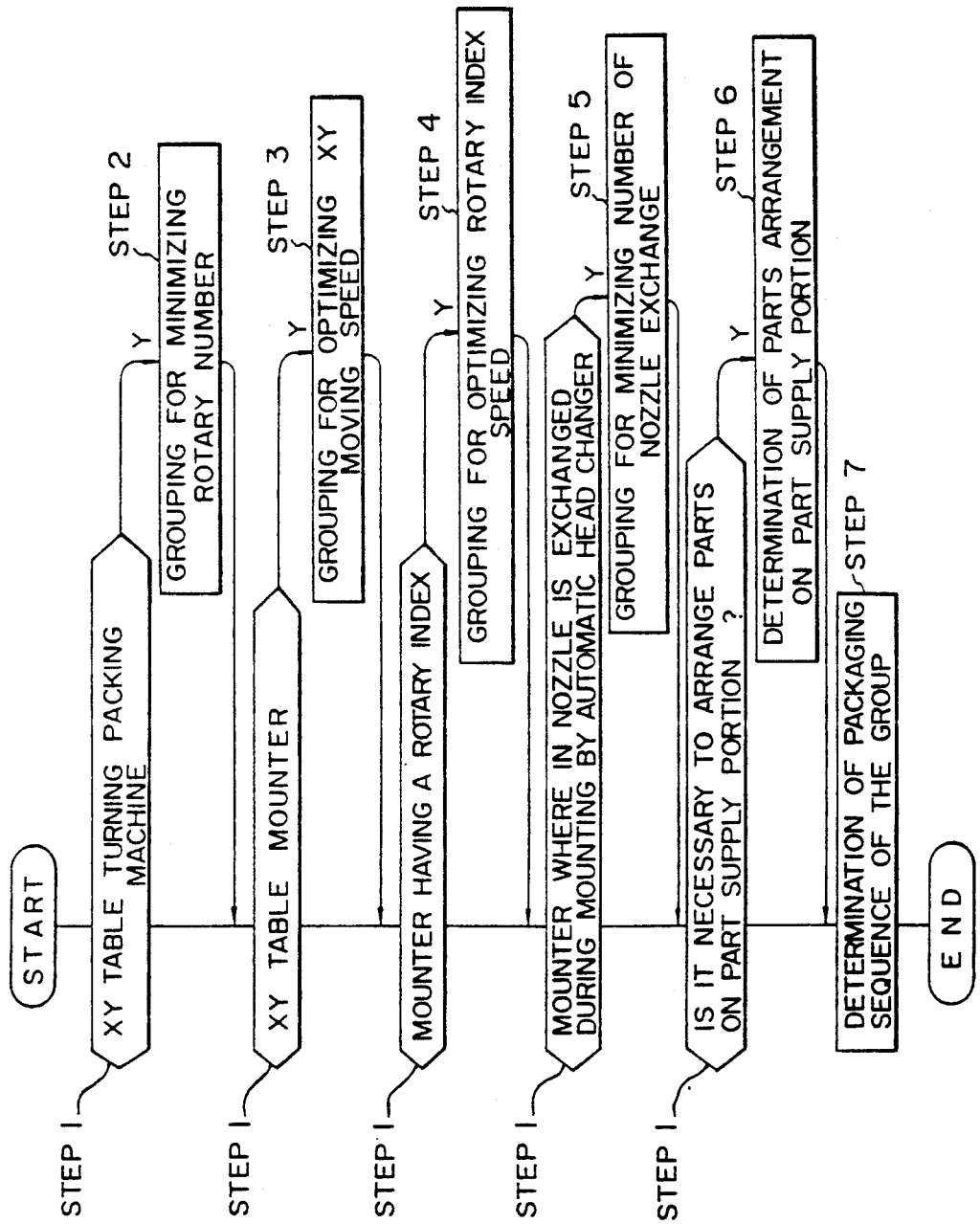
FIG. 1 is a flow diagram showing a packaging sequence determining method of this invention.

The process of this packaging sequence determining method will now be described in connection with FIG. 1.

The term "grouping", which appears at each of steps 2 through 5, means to put a number of parts to be mounted successively into a single set.

At step 1, the process is selected to comply with each type of packaging machine. This selection may be performed automatically or manually.

Steps 2, 7 are automatically selected for the XY table turning inserter; step 7, for the XY head turning inserter; steps 3, 4, 7, for the one-by-one-sequence mounter; steps 3, 4, 7, for the XY-table-type one-by-one random access mounter; and steps 5, 7, for the XY-head-type one-by-one random access mounter.

The arrangement of parts on the part supply portion may be determined fixedly or may be changed for each substrate, depending on the form of use by a user.

In the case where the arrangement of parts is to be changed for each substrate, the process of step 6 is selected to determine the arrangement of the parts at the same time, irrespective of the packaging machine type. The processing sequence is in the order of step number.

In the case of manual selection, steps 2 through 6 are selected in an optional sequence, and step 7 should be selected without fail.

Step 2 will now be described.

Figure 13:
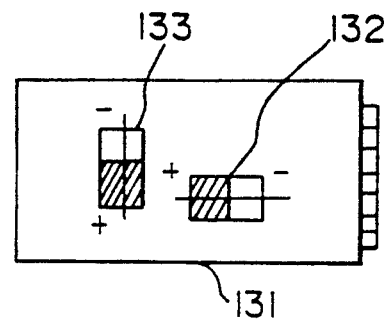
FIGS. 13 and 14 illustrate the packaging sequence determining process of a packaging machine having a turntable according to this invention.

When two parts 132, 133 are to be mounted on a printed circuit board 131 with different orientations as shown in FIG. 13, the head of a packaging machine or the printed circuit board 131 should be turned to change the mounting orientation.

In a packaging machine such as the XY table turning inserter (FIG. 8(a)) in which the printed circuit board 131 is turned to change the mounting orientation, since originally the time needed to turn is long, the parts which are to be mounted with the same orientation should preferably be grouped into a single set to be successively mounted.

Then the turning sequence of the substrate is optimized.

Figure 14A:
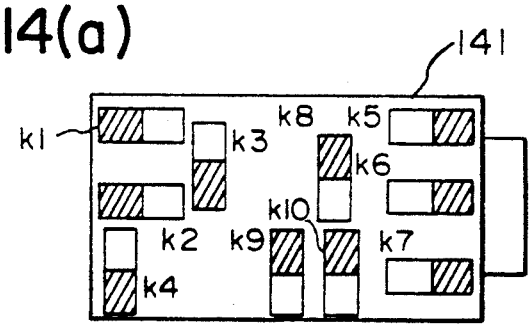

The optimization will now be described in connection with an example in which parts K1 through K10 are to be mounted with the respective orientations as shown in FIG. 14(a).

Figure 14B:
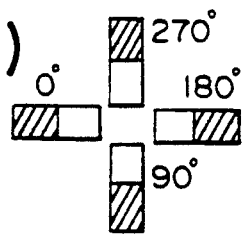

In this example, the parts K1, K2, the parts K3, K4, the parts K5, K6, K7 and the parts K8, K9, K10 are mounted at 0°, 90°, 180° and 270°, respectively, while the printed circuit board 141 is turned at 0°, 90°, 180° and 270° in the described order. The definition of these angles is shown in FIG. 14(b).

At that time, if there is a constraint that "the part K3 should be mounted before the part K2", the printed circuit board 141 should be turned through 0°, 90°, 0°, 270° and 180° in the described order, for example (if the initial direction is 0°).

Figure 3:
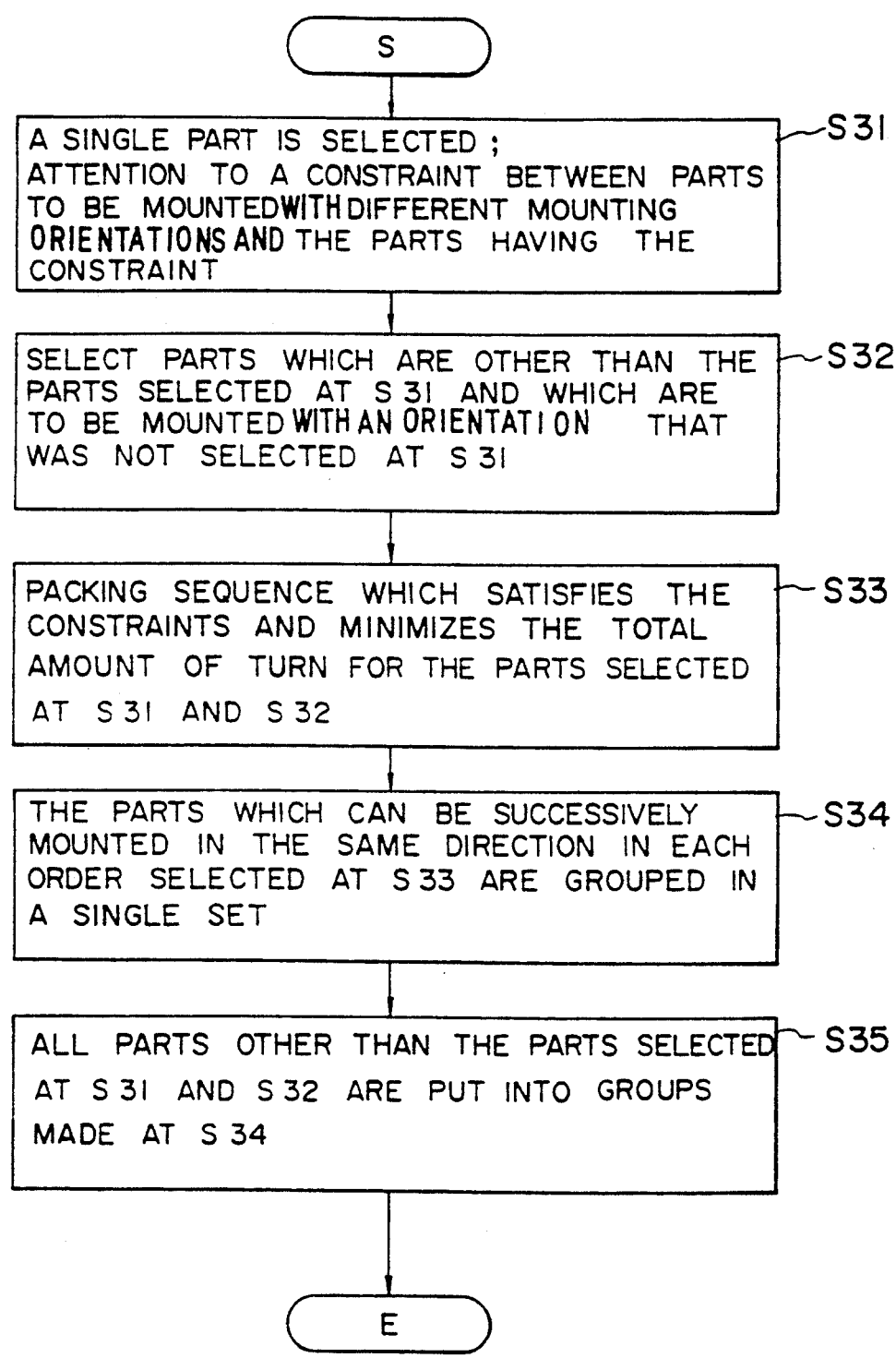
FIG. 3 is a flow diagram showing a grouping process which minimizes the number of turns of a substrate.

The packaging sequence of FIG. 3 will now be described in connection with this example.

(1) S31

Attention is paid to both a constraint between parts to be mounted with different mounting orientations and the parts having the constraint.

In this example, attention is paid to a constraint that "the part K3 should be mounted before the part K2" and to these parts K2, K3.

(2) S32

Then parts which are other than the parts selected at S31 and which are to be mounted with an orientation that was not selected at S31 are selected.

In this example, the parts K5, K8 to be mounted in the directions of 180° and 270° are selected.

(3) S33

For the parts selected at S31 and S32, a packaging sequence which satisfies the constraints concerning the packaging sequence and which minimizes the total amount of turn of the printed circuit board 141 is determined.

In this example, the parts K2, K3, K5, K8 at S31 and S32 are sequenced as K3-K2-K8-K5.

(3) S34

The parts which can be successively mounted in the same direction in each order selected at S33 are grouped in a single set.

In this example, since only one part can be mounted in the same direction at each order of K3-K2-K5-K8 selected at S33, a single part is grouped in a single set at each order.

(4) S35

All parts other than the parts selected at S31 and S32 are put into groups made at S34.

In this example, the remaining parts (other than the parts K3, K2, K5, K8) are put in groups so as to be mounted with the same orientation as the parts K3, K2, K5, K6, K8, respectively.

As a result, the packaging sequence K3, K4-K2, K1-K5, K7-K8, K9, K10 is obtained, and the amount of turn is minimized.

Incidentally, in the aforementioned step 2, the rotary table is used as a table and therefore, the amount of displacement corresponds to the amount of turn, but the present invention is not limited to this. The movement in the XY direction may be the amount of displacement.

Figure 10:
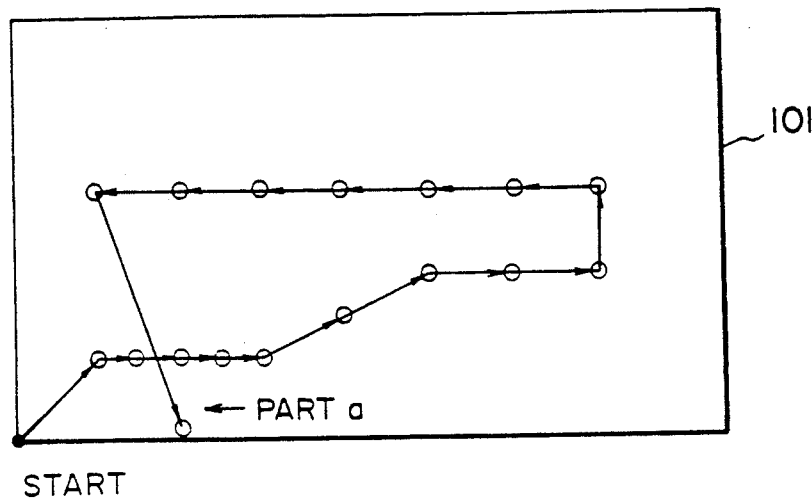
FIGS. 10 through 12 illustrate a conventional packaging sequence determining method.
Figure 11A:
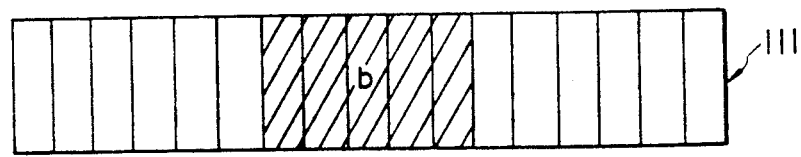
Figure 11B:
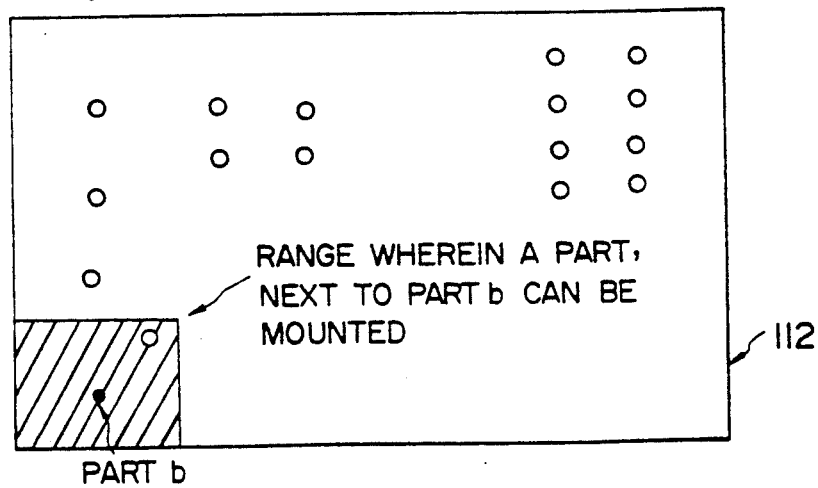
Figure 12:
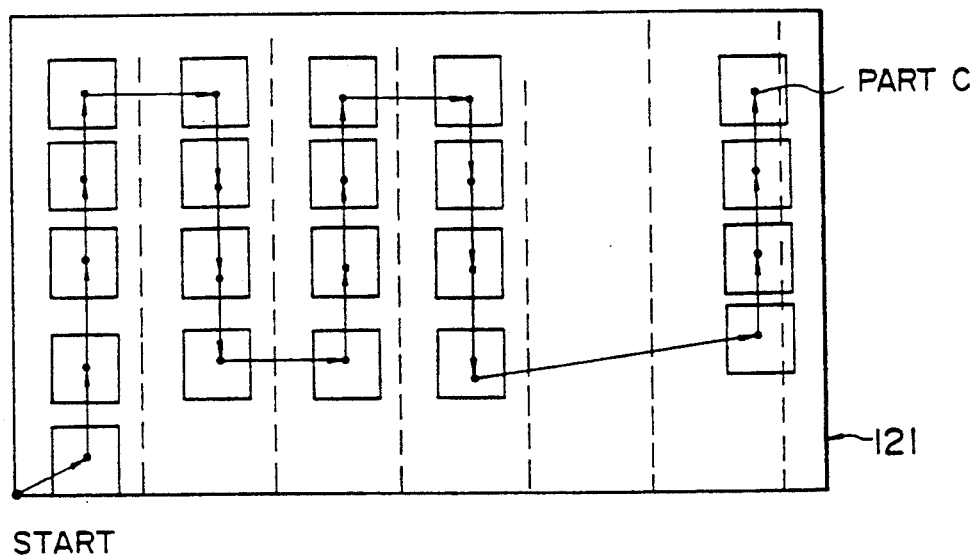

The above-mentioned packaging method prevents that some parts that are located relatively nearby the parts being mounted would not be the nearest parts and would be left behind to the last, as shown in FIG. 10, which results in increasing of the moving time of the table, i.e., increasing of the packaging time.

Step 3 will now be described.

In this step, constraints concerning the packaging sequence are satisfied, whereupon parts are grouped so as to optimize the moving speed of the XY table.

The moving speed of the XY table is determined depending on the shape of a previously mounted part; therefore, after a cylindrical part, which is easy to roll, has been mounted, the moving speed of the XY table should be lowered. In order words, the moving speed of the XY table cannot be increased after a part which may easily roll has been mounted on the XY table, and therefore, parts which will not easily roll should be mounted before parts which will.

Consequently, the parts pertaining to the same moving speed are grouped into a single set, and the packaging sequence between groups is such that the parts of a higher speed group are mounted before the parts of a lower speed group.

Considering the moving speed for the parts which have already been mounted by another packaging machine, the maximum moving speed should be such that among the already mounted parts, those easiest to displace will not be displaced on the XY table.

If there is a constraint concerning the packaging sequence, the lower speed parts are mounted before the higher speed parts; in such case, the higher speed parts should be put in the group of the lower speed parts.

Figure 4:
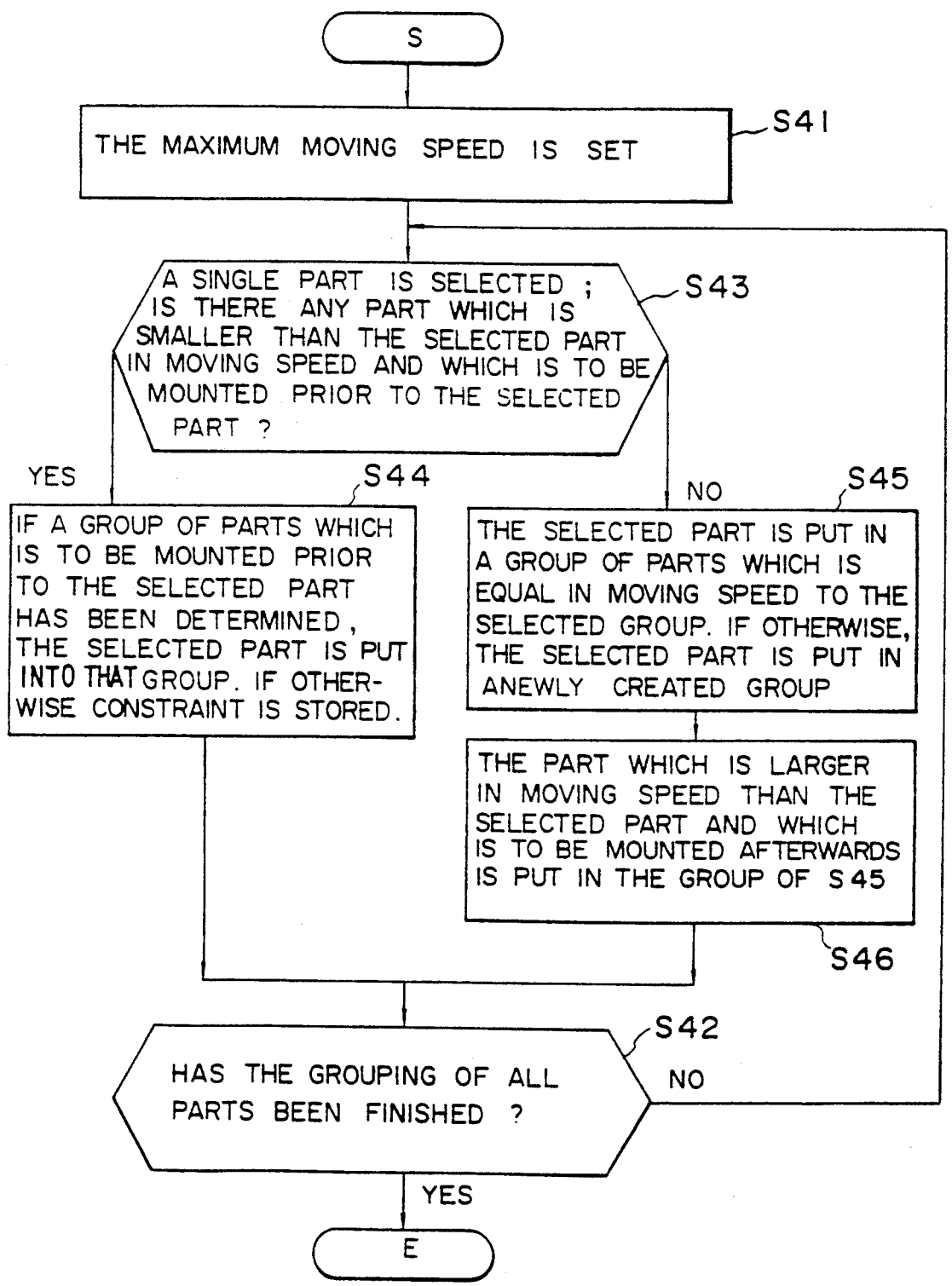
FIG. 4 is a flow diagram showing a grouping process which optimizes the moving speed of an XY table.

The detailed packaging sequence will now be described with reference to FIG. 4.

(1) S41

The maximum moving speed is set from the parts which have already been mounted by another packaging machine.

Then the procedures of S43 through S46 are performed for all parts.

(2) S43

A single part is selected.

If there is any part which is smaller in moving speed than a part selected from a constraint and which is to be mounted before the selected part, the procedures of S44 are performed. If otherwise, the procedures of S45 and S46 are performed.

(3) S44

If a group of parts which is smaller in moving speed than the selected part and which is to be mounted prior to the selected part has already been determined, the selected part is put into that group. If otherwise, the foregoing constraint is stored.

Then the routine goes to S42.

(4) S45

If there is a group of parts which is equal in moving speed to the selected part, the selected part is put in that group. If otherwise, the selected part is put in a newly created group.

(5) S46

If there is a part which is to be mounted after a part selected from a constraint and which is larger in moving speed than the selected part, the part to be mounted afterwards is also put in the group of S45.

Then the routine goes to S42.

(6) S42

If the grouping of all parts has been finished, step 3 terminates.

If otherwise, the routine goes to S43.

Step 4 will now be described.

In this step, constraints concerning the packaging sequence are satisfied, whereupon parts are grouped so as to optimize the moving speed of the rotary index.

Figure 5:
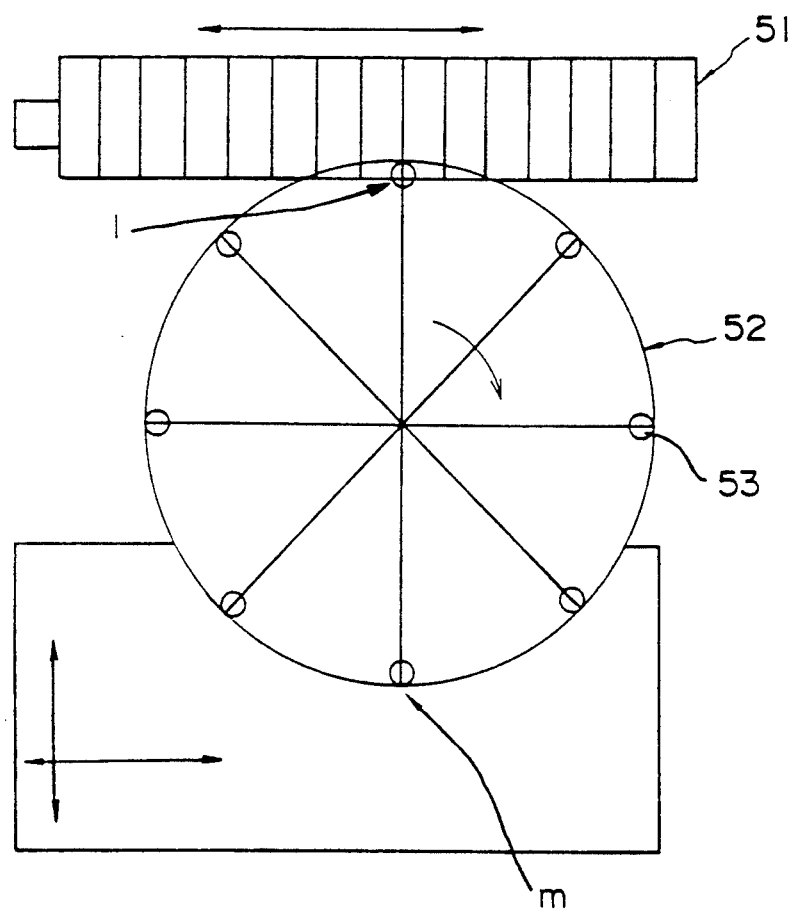
FIG. 5 is a diagram showing a rotary index.

The rotary index 52, as shown in FIG. 5, has along its circumference a plurality of suction heads 53 so as to suck a part at the suction position 1 and to mount the part at the mounting position m after turning through 180°.

If the turning speed of the rotary index 52 is relatively high when a large planar part is sucked, the part tends to become displaced or to be shaken off by centrifugal force. Consequently, the turning speed of the rotary index 52 should be determined depending on the shape of a part.

If the turning speed is restricted to the minimum speed part when a plurality of parts are sucked onto the rotary index 52, as many of the same speed parts as possible should preferably be grouped into a single set to be successively mounted, which assists in improving the packaging speed.

Figure 6:
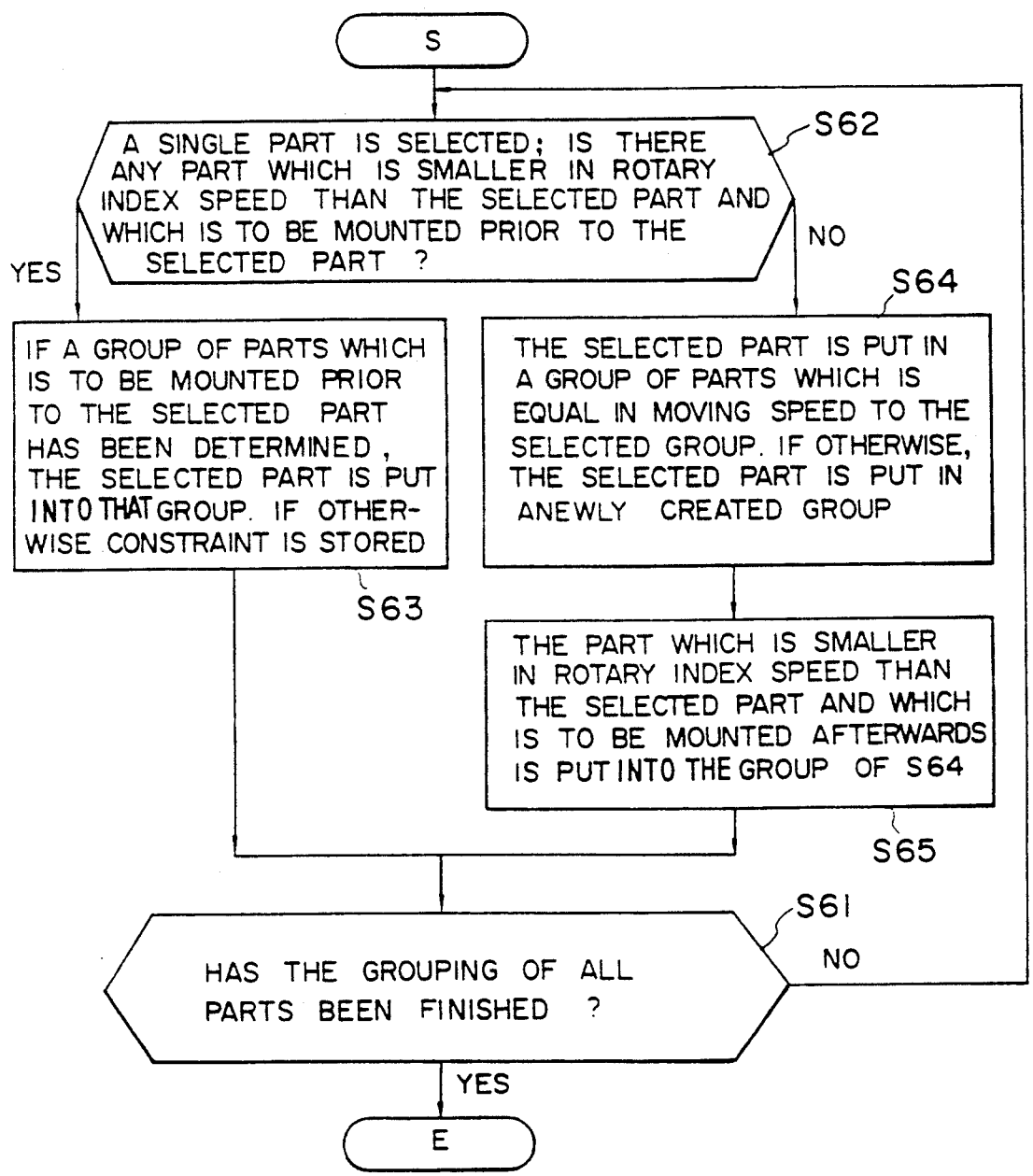
FIG. 6 is a flow diagram showing a grouping process which optimizes the turning speed of the rotary index.

Then the grouping is performed in the manner shown in FIG. 6.

For all parts the procedures of S62 through S65 are performed as follows.

(1) S62

A single part is selected.

If there is any part which is smaller in rotary index speed than a part selected from a constraint and which is to be mounted before the selected part, the procedure of S63 is performed. If otherwise, the procedures of S64 and S65 are performed.

(2) S63

If there is a group of parts which is smaller in rotary index speed than the selected part, the selected part is put into that group. If otherwise, the above-described constraint is stored.

Then the routine goes to S61.

(3) S64

If there is a group of parts which is equal in rotary index speed to the selected part, the selected part is put into that group. If otherwise, the selected part is put into a newly created group.

(4) S65

If there is a part which is to be mounted after a part selected from a constraint and which is larger in rotary index speed than the selected part, the part to be mounted afterwards is also put into the group of S65.

Then the routine goes to S61.

(5) S61

If the grouping of all parts has been finished, step 4 terminates.

If otherwise, the routine goes to S62.

Step 5 will now be described.

The XY-head-type one-by-one random access mounter (FIG. 8(e)) is exemplified by a mounter in which a nozzle serving as the holding portion of a parts holding means is exchanged with another during the mounting by an automatic head changer (a tool changing unit).

This mounter is particularly useful when mounting many kinds of parts of different shapes by a single packaging machine.

Figure 15A:
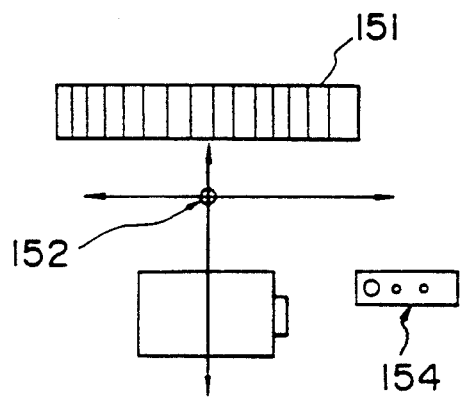
FIGS. 15(a) and 15(b) show a packaging machine having a exchangeable nozzle.

This mounter is shown in FIG. 15(a).

The mounter has a suction nozzle at the distal end of the head for sucking parts one at a time.

Since a suitable size of nozzle must be selected depending on the size of the part to be sucked, a lot of time is required for nozzle exchange.

Figure 15B:
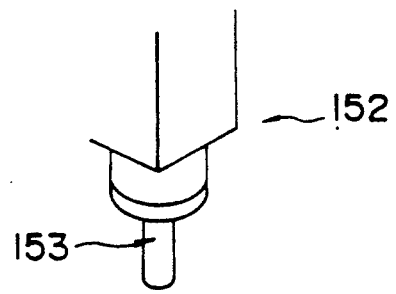
Figure 16:
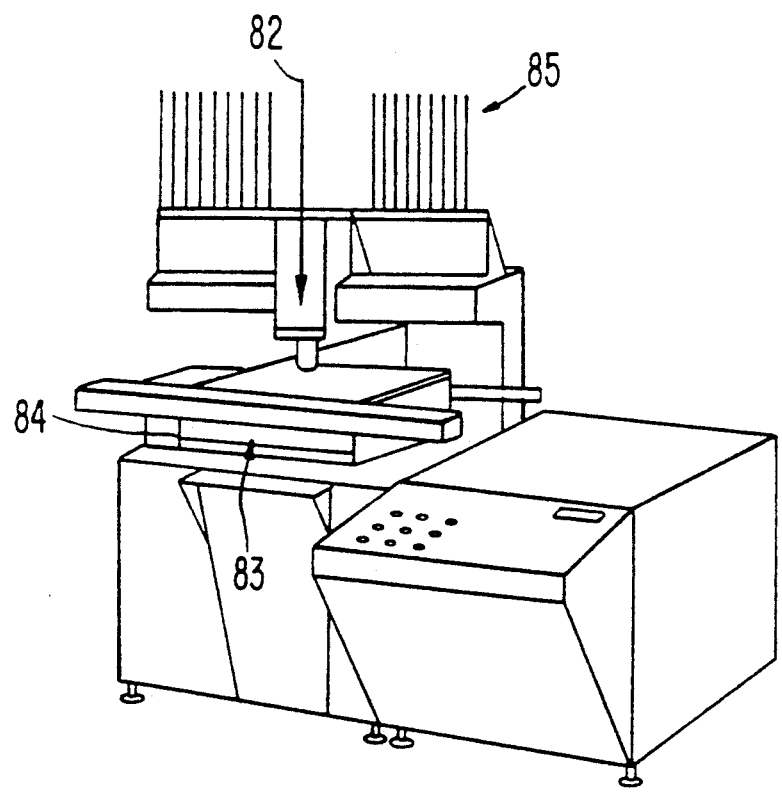
FIGS. 16–20 show prior art packaging machines.
Figure 17:
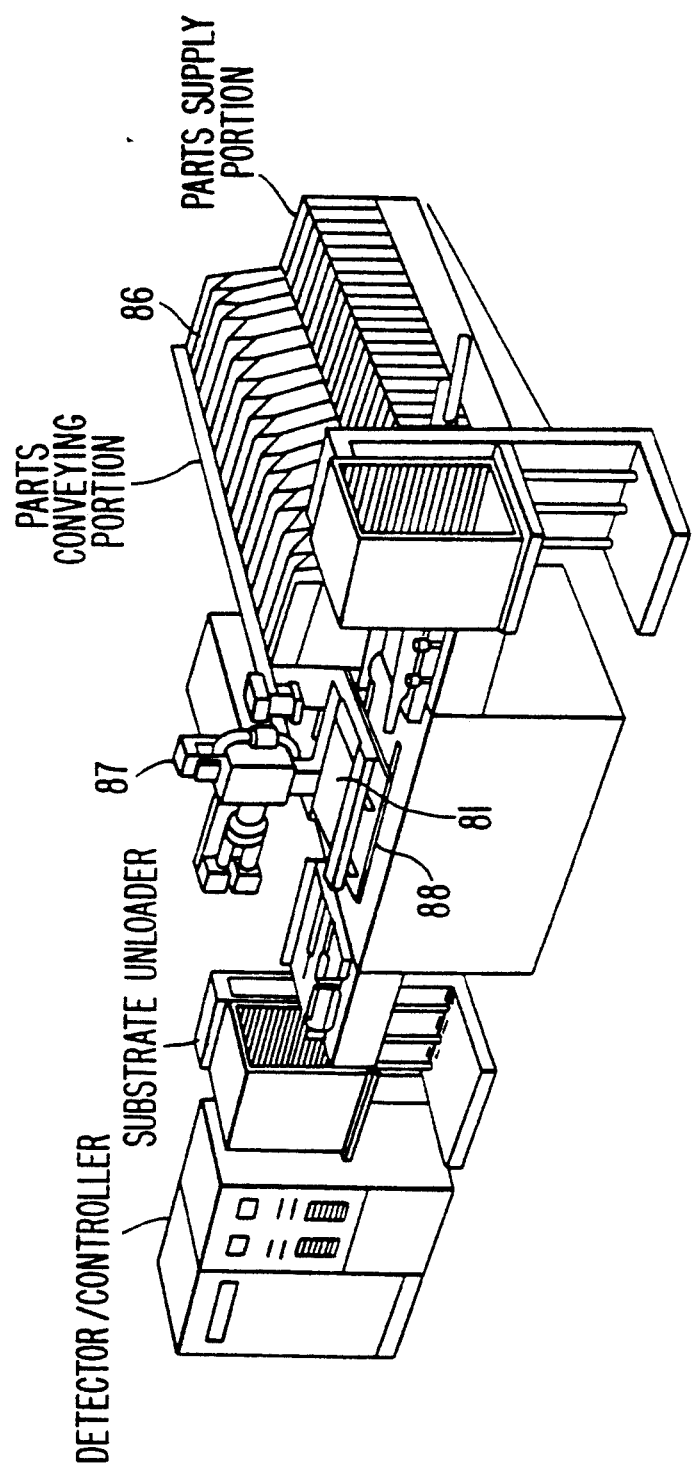
Figure 18:
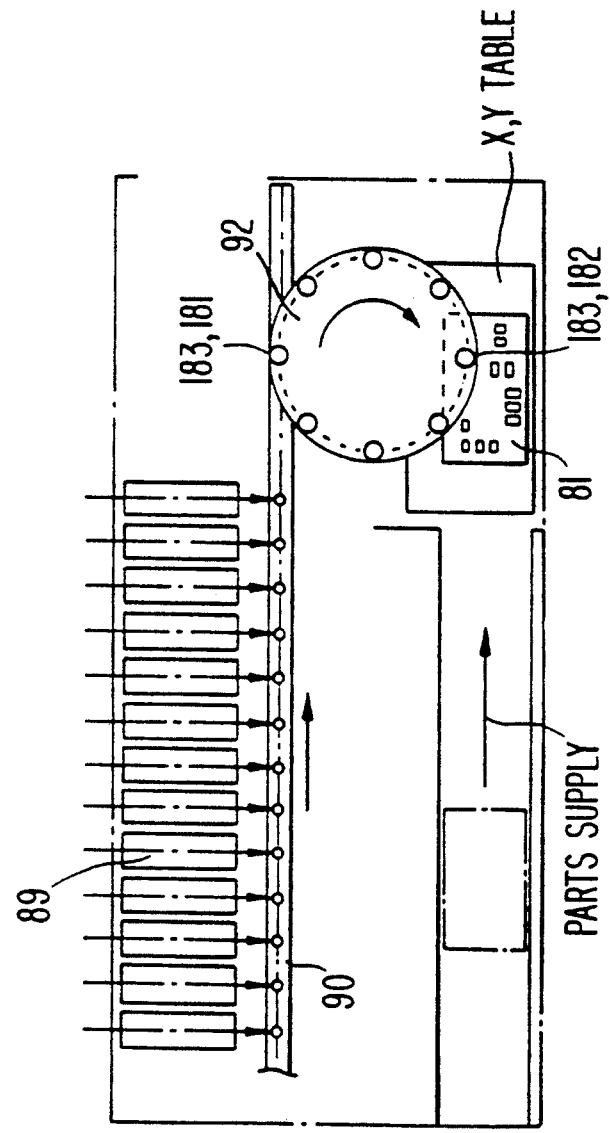
Figure 19:
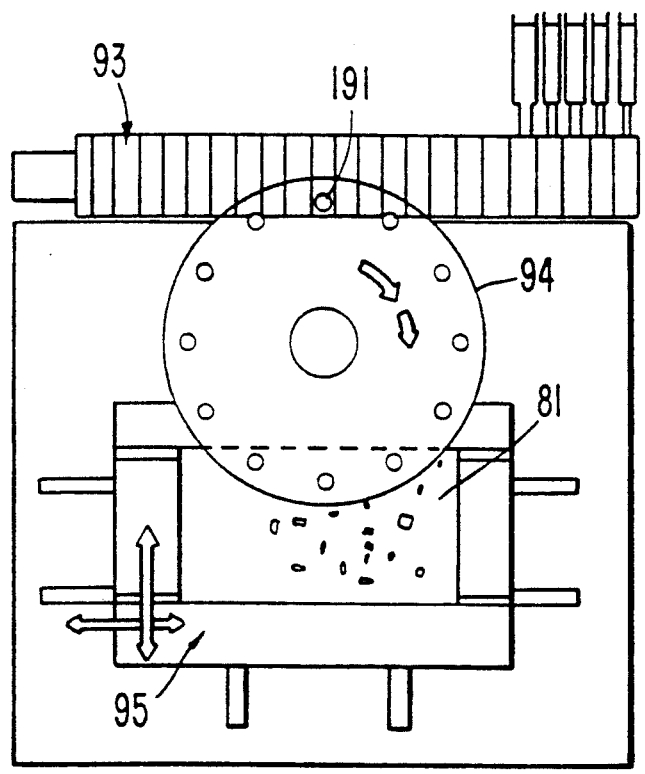
Figure 20:
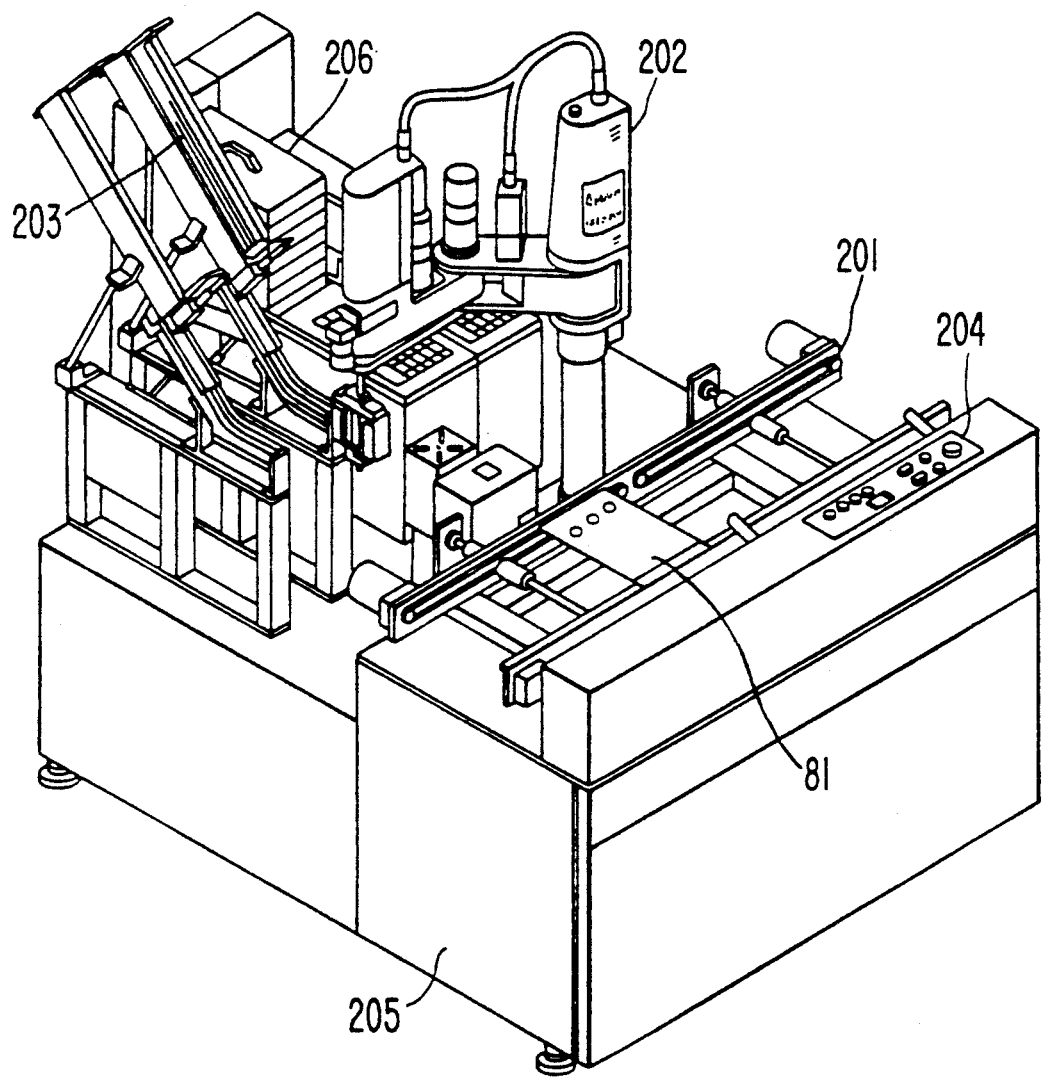

A nozzle 153 is detachably fitted in the distal end of a head 152 as shown in FIG. 15(b); when parts are changed, the head 152 moves in the XY direction to a tool change unit 154 (in which various nozzles of different sizes are set) to automatically exchange the nozzle with another.

In order to minimize the time taken to exchange the nozzle, as many parts as possible which can be mounted by the same nozzle are grouped into a single set to be successively mounted.

However, if, for example, there is a constraint (concerning the packaging sequence) p-r-q between the parts p, q to be mounted by a nozzle N1 and the part r to be mounted by a nozzle N2, the mounting of parts must be performed by the nozzle N1, then by the nozzle N2 and again by the nozzle N1.

Thus, in this case, the parts p and the parts q must be grouped separately.

Considering this case, the grouping is performed in the manner shown in FIG. 7 in order to minimize the number of exchange of the nozzle.

This grouping will now be described.

Assuming that the parts L1, L2, the parts L3 through L5 and the parts L6 through L10 are mounted by the nozzle N1, N2 and N3, respectively, the nozzles are exchanged in the order of N1-N2-N3 during mounting.

If there are the following constraints between parts, it is most suitable that the nozzles are exchanged in the order of N1-N3-N2 -N3.

Constraints

L1-L6-L3

L7-L4-L8

L5-L9

The procedures of FIG. 7 will now be described in connection with this case.

(1) S71

A single part is selected.

Attention is paid to constraints between parts to be mounted by different nozzles and to the selected part.

In this example, attention is paid to the constraints L1-L6-L3, L7-L4-L8, L5-L9 and to the parts L1, L6, L3, L7, L4, L8, L5, L9.

(2) S72

Attention is paid to, among the parts other than the parts selected at S71, the parts to be mounted by the nozzle which were not selected at S71.

In this example, all nozzles N1, N2, N3 are used for the parts selected at S71 (there is no part to which no nozzle was selected at S71).

(3) S73

For the parts selected at S71 and S72, a packaging sequence so as to satisfy the constraints and so as to minimize the number of exchanges of the nozzle.

In this example, for the parts L1, L6, L3, L7, L4, L8, L5, L9, the packaging sequence is preferably be determined as L1-L6-L7-L3-L4-L5-L8-L9 (the number of exchanges of the nozzle is three, and the constraints are satisfied).

(4) S74

In this packaging sequence, the parts to be successively mounted by the same nozzle are grouped.

In this example, the result of grouping is L1 (the nozzle N1 is use) -L6, L7 (the nozzle N3 is used) -L3, L4, L5 (the nozzle N2 is used) -L8, L9 (the nozzle N3 is used).

(5) S75

All parts other than the parts selected at S71 and S72 are put in the groups created at S74.

In this example, the parts L2 and L10 are added to determine the grouping and sequence L1, L2 - L6, L7 - L3, L4, L5 - L8, L9, L10.

Step 6 will now be described.

For each of the groups determined at steps 2 through 5, the range in which the parts are to be arranged on the parts supply portion is determined, and also the arrangement of parts in the range is determined for each group.

The size of the using region is determined based on the number of kinds of parts to be mounted for each group is determined. Then the parts are arranged in accordance with the packaging sequence of each group.

The arrangement of parts of each group is such that the kind of parts which are largest in number are arranged at the center of the range, whereupon other kinds after parts are arranged outwardly from the previously arranged parts one kind to another in the order of number of parts so that the number of parts spaced a larger distance from the substrate (mounting position) is smaller than the number of parts spaced a smaller distance from the substrate.

Step 7 will now be described.

A packaging sequence such that the packaging time of parts in the groups determined at steps 2 through 5 is shortest is determined.

The standby time depends on the packaging sequence.

The standby time must be minimized to reduce the packaging time, which depends on the type of packaging machine. Consequently, the standby time between the parts is calculated according to the operation of the packaging machine, whereupon a packaging sequence such that the standby time is minimum is realized.

As described above, according to this invention, by minimizing the number of turns of the substrate upon satisfaction of constraints concerning the packaging sequence, by grouping the parts so as to optimize the moving speed of the XY table, by grouping the parts so as to optimize the rotary index speed and by grouping the parts so as to minimize the number of nozzle exchanges, it is possible to determine a packaging sequence in accordance with the operation characteristics of a packaging machine so as to satisfy the constraints.

Further, by considering not only the moving speed after the parts have been mounted by each packaging machine but also the moving speed of the parts which have already been mounted by another packaging machine, it is also possible to determine the most suitable packaging sequence when mounting the parts using a plurality of packaging machines.

In determining the packaging sequence in each group, by inputting the operation characteristics of the packaging machine, by calculating the standby time between the parts of each group in accordance with the operation of the packaging machine, and by determining the packaging sequence so as to minimize the total standby time, it is possible to reflect the operation characteristics of the packaging machine with ease on determination of the packaging sequence.

When changing the arrangement of the parts supply portion for each substrate, the time needed to move the parts supply portion can be reduced by determining the range of use of the parts supply portion of each group and by determining the arrangement of parts in the range of use of the parts supply portion for each group.

Thus, it is possible to determine the packaging sequence so as to satisfy constraints and so as to comply with the operation characteristics (or the packaging machine structure) of various types of packaging machines.

What is claimed is:

1. A method of determining a packaging sequence of parts to be mounted on a substrate placed on a table in a packaging machine and displacing the table relative to parts holding means at a plurality of times so that the parts are mounted at every displacement of the table in a plurality of designated positions, said method comprising the steps of:

determining a displacing sequence and an amount of displacement of the table to satisfy a constraint concerning the packaging sequence of parts and to minimize a total amount of displacement of the table; and grouping parts that are to be successively mounted on the substrate at each of the designated positions on the table being displaced relative to the parts holding means.

2. A method according to claim 1, wherein when determining the packaging sequence in which the parts of one group are mounted on the substrate, in a minimum amount of time, a packaging standby time between the mounting of each part and the mounting of the next part machine, and a minimum total packaging time is determined.

3. A method according to claim 1, further comprising the steps of:

determining, after said grouping step, a range of use from which the parts of each group are to be supplied;

determining an arrangement of the parts within the range of use of each group; and determining the packaging sequence of each group based on the determined arrangement of the parts.

4. A method of determining a packaging sequence of parts to be mounted on a substrate placed on a table in a packaging machine and turning the table at a plurality of times so that the parts are mounted at every turn of the table in a plurality of designated positions, said method comprising the steps of:

determining an angle and a direction of a turn of the table and a turning sequence of the table to satisfy a constraint concerning the packaging sequence of parts and to minimize a total amount of turning of the table; and grouping parts that are to be successively mounted on the substrate at each of the designated positions on the table.

5. A method according to claim 4, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

6. A method according to claim 4, further comprising the steps of:

determining, after said grouping step, a range of use from which the parts of each group are to be supplied;

determining an arrangement of the parts within the range of use of each group; and determining the packaging sequence of each group based on the determined arrangement of the parts.

7. A method of determining a packaging sequence of parts to be mounted on a substrate placed on a table in a packaging machine and moving the table at a plurality of times so that the parts are mounted at every movement of the table in a plurality of designated positions, said method comprising the steps of:

segmenting a movable speed of the table to determine a speed and a moving sequence for moving the table to satisfy a constraint concerning the packaging sequence of parts and to optimize the movable speed of the table after the parts are mounted on the substrate, the movable speed being predetermined for each of the parts, and grouping parts having the same speed segment.

8. A method according to claim 7, wherein the moving speed of the table is segmented based on the moving speed of the parts to be mounted by the packaging machine and the moving speed of the parts that have already been mounted by another packaging machine.

9. A method according to claim 7, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

10. A method according to claim 7, further comprising the steps of:

determining, after said grouping step, a range of use from which the parts of each group are to be supplied;

determining an arrangement of the parts within the range of use of each group; and determining the packaging sequence of each group based on the determined arrangement of the parts.

11. A method of determining a packaging sequence of parts to be mounted on a substrate in a packaging machine, wherein the parts are mounted in a plurality of designated positions, the packaging machine having a rotary index which picks up and holds the parts to carry them to the designated positions on the substrate, said method comprising the steps of:

segmenting a movable speed of the rotary index to determine a speed segment and a turning sequence to turn the rotary index to satisfy a constraint concerning the packaging sequence of parts and to optimize the movable speed of the rotary index, the movable speed being a predetermined speed for each of the parts at which the rotary index is capable of turning and holding the parts; and grouping parts having the same speed segment and the same turning sequence.

12. A method according to claim 11, further comprising the steps of:

determining, after said grouping step, a range of use from which the parts of each group are to be supplied;

determining an arrangement of the parts within the range of use of each group; and determining the packaging sequence of each group based on the determined arrangement of the parts.

13. A method according to claim 11, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

14. A method of determining a packaging sequence of parts to be mounted on a substrate in a packaging machine, wherein the parts are mounted in a plurality of designated positions, said packaging machine having parts holding means including parts holding portions changeable according to parts to be held, said method comprising the steps of:

determining an exchange sequence for changing the parts holding portions to satisfy a constraint concerning the packaging sequence of parts and so as to optimize a number of exchanges of the parts holding portions; and grouping parts that require the same parts holding portions and the same exchanging sequence.

15. A method according to claim 14, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

16. A method according to claim 14, further comprising the steps of:

determining, after said grouping step, a range of use from which the parts of each group are to be supplied;

determining an arrangement of the parts within the range of use of each group; and determining the packaging sequence of each group based on the determined arrangement of the parts.

17. A method of determining a packaging sequence of parts to be mounted on a substrate placed on a table in a packaging machine, wherein the parts are mounted in a plurality of designated positions, said method comprising the steps of:

segmenting a movable speed of the table to determine a speed segment and a moving sequence for moving the table based on a constraint concerning the packaging sequence of parts and an allowable moving speed for each part when mounted; and grouping parts having the same speed segment.

18. A method according to claim 17, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

19. A method according to claim 17, further comprising the steps of:

determining, after said grouping step, a range of use from which the parts of each group are to be supplied;

determining an arrangement of the parts within the range of use of each group; and determining the packaging sequence of each group based on the determined arrangement of the parts.

20. A method of determining a packaging sequence of parts to be mounted on a substrate in a packaging machine, wherein the parts are mounted in a plurality of designated positions, the packaging machine having a rotary index which picks up and holds parts to carry them to the designated positions on the substrate, said method comprising the steps of:

segmenting a movable speed of the rotary index to determine a speed segment and turning sequence to turn the rotary index based on a constraint concerning the packaging sequence of the parts and a turning speed of the rotary index when the parts are attached to the rotary index; and grouping parts having the same speed segment and the same turning sequence.

21. A method according to claim 20, wherein when determining the packaging sequence in which the parts of one group are mounted on the substrate in a minimum amount of time, a packaging standby time between the mounting of each part and the mounting of the next part within the same group is calculated according to the operation of the packaging machine, and a minimum total packaging time is determined.

22. A method according to claim 20, further comprising the steps of:

determining, after said grouping step, a range of use from which the parts of each group are to be supplied;

determining an arrangement of the parts within the range of use of each group; and determining the packaging sequence of each group based on the determined arrangement of the parts.

23. A method of determining a packaging sequence of parts on a substrate in a plurality of packaging machines, wherein the parts are mounted on the substrate in a plurality of designated positions, said method comprising the steps of:

(a) selecting one or more of the following steps:

(i) placing the substrate on a turning table, determining an angle and a direction of turning of the table at each turn and a turning sequence of the table to satisfy a constraint concerning the packaging sequence and to optimize a total amount of turn of the table when the table turns at a plurality of times to mount the parts at every turn in predetermined positions and grouping parts that are to be successively mounted on the substrate at each oaf the designated positions, (ii) placing the substrate on a moving table, segmenting a movable speed to determine a speed segment and moving sequence for moving the table to satisfy a constraint concerning the packaging sequence of the parts and to optimize the movable speed of the table after the parts are mounted on the substrate when mounting the parts on the substrate, the movable speed being predetermined for each of the parts and grouping parts that pertain to the same speed segment, (iii) segmenting, when the parts are mounted with the packaging machines each having a rotary index, a movable speed of the rotary index to determine a speed segment and a turning sequence for turning the rotary index to satisfy a constraint concerning the packaging sequence and to optimize the turnable speed of the rotary index and the grouping parts that pertain to the same turning sequence and the same speed segment, (iv) determining, when the parts are mounted with the packaging machines each having parts holding means including parts holding portions changeable according to parts to be held, an exchanging sequence for exchanging the parts holding portions to satisfying a constraint concerning the packaging sequence of the parts and to minimize a number of exchanges of the parts holding portions, and grouping the parts that pertain to the same parts holding portions in the same exchanging sequence; and (b) determining a packaging sequence in which parts of one group are mounted on the substrate in a minimum amount of time.

* * * * *